United States Patent [19]
Ding et al.

[11] Patent Number: 6,076,482
[45] Date of Patent: Jun. 20, 2000

[54] THIN FILM PROCESSING PLASMA REACTOR CHAMBER WITH RADIALLY UPWARD SLOPING CEILING FOR PROMOTING RADIALLY OUTWARD DIFFUSION

[75] Inventors: Ji Ding, Newark; James Carducci, Sunnyvale; Hongching Shan, San Jose; Siamak Salimian, Sunnyvale; Evans Lee, Milpitas; Paul E. Luscher, Sunnyvale; Mike Welch, Livermore, all of Calif.

[73] Assignee: Applied Materials, Inc., Santa Clara, Calif.

[21] Appl. No.: 08/937,347

[22] Filed: Sep. 20, 1997

[51] Int. Cl.$^7$ .............................. C23C 16/00; C23F 1/02; H01L 21/302

[52] U.S. Cl. ............ 118/723 R; 156/345; 118/723 MW; 118/723 I; 118/723 E; 438/710; 438/726; 438/758

[58] Field of Search ...................... 156/345; 118/723 E, 118/723 I, 723 IR, 723 MW, 723 ME, 723 ER, 715, 723 R; 204/298.31, 298.34, 298.02, 298.06; 315/111.21, 111.51, 111.71

[56] References Cited

U.S. PATENT DOCUMENTS

| | | | |
|---|---|---|---|
| 5,698,062 | 12/1997 | Sakamoto et al. | 156/345 |
| 5,718,795 | 2/1998 | Plavidal et al. | 156/345 |
| 5,753,044 | 5/1998 | Hanawa et al. | 118/723 I |
| 5,846,883 | 12/1998 | Moslehi | 438/711 |
| 5,874,704 | 2/1999 | Gates | 219/121.43 |
| 5,897,712 | 4/1999 | Hanawa et al. | 216/68 |

FOREIGN PATENT DOCUMENTS

| | | |
|---|---|---|
| 794553 A2 | 9/1997 | European Pat. Off. . |
| 820087 A2 | 1/1998 | European Pat. Off. . |
| 860856 A1 | 8/1998 | European Pat. Off. . |

*Primary Examiner*—Paul Thibodeau
*Assistant Examiner*—Sheeba Ahmed
*Attorney, Agent, or Firm*—Michaelson and Wallace

[57] ABSTRACT

The invention contours the chamber surface overlying semiconductor wafer being processed (i.e., the chamber ceiling) in such a way as to promote or optimize the diffusion of plasma ions from their regions of origin to other regions which would otherwise have a relative paucity of plasma ions. This is accomplished by providing a greater chamber volume over those areas of the wafer otherwise experiencing a shortage of plasma ions and a smaller chamber volume over those areas of the wafer experiencing a plentitude of plasma ions (e.g, due to localized plasma generation occurring over the latter areas). Thus, the ceiling is contoured to promote a plasma ion diffusion which best compensates for localized or non-uniform patterns in plasma ion generation typical of an inductively coupled source (e.g., an overhead inductive antenna). Specifically, the invention provides a lesser ceiling height (relative to the wafer surface) over regions in which plasma ions are generated or tend to congregate and a greater ceiling height in other regions. More specifically, in the case of an overlying inductive antenna where plasma ion density tends to fall off toward the wafer periphery, the ceiling contour is such that the ceiling height increases radially, i.e., toward the wafer periphery. This promotes or increases plasma ion diffusion toward the wafer periphery as a function of the rate at which the ceiling height increases radially.

36 Claims, 7 Drawing Sheets

THIN FILM PROCESSING PLASMA REACTOR CHAMBER WITH RADIALLY UPWARD SLOPING CEILING FOR PROMOTING RADIALLY OUTWARD DIFFUSION

BACKGROUND OF THE INVENTION

1. Technical Field

The invention is related to a plasma reactor chamber in which a semiconductor wafer is processed in which local generation of plasma ions is distributed through diffusion, and the diffusion is enhanced by the shape of the chamber.

2. Background Art

In microelectronic integrated circuit fabrication, plasma processing of semiconductor wafers is used for etching dielectric (e.g., silicon dioxide) thin films or layers and conductive (e.g., aluminum) films from the top surface of a wafer, and for deposition of various materials onto the top surface of a wafer. The constant trend in integrated circuit development and fabrication is toward ever smaller device geometry or feature size without sacrificing the production rate of plasma processing, such as the etch rate of a plasma etch reactor. This in turn requires that in a plasma etch reactor a reasonably high plasma ion density be maintained across the top surface of the wafer. One way of maintaining a high plasma ion density in the reactor chamber is to maintain a relatively high chamber pressure, particularly in the case of a capacitively coupled plasma reactor. In a capacitively coupled plasma reactor, the desirable chamber pressure range is around 150 mT to 400 mT. Such a high chamber pressure is required to assure a sufficient number of collisions between each hot electron and plasma ion precursor species before the hot electron is lost upon collision with the wafer and the wall. This is particularly true where the gap between the plasma source power radiator (e.g., a top electrode) and the semiconductor wafer surface is short.

One problem with maintaining the plasma reactor chamber pressure at such a high range is that it is more difficult to pump out or replace plasma gases containing etch byproducts with newly created etchant-species plasma ions. This problem is most pronounced as the semiconductor device feature size is decreased. As a result, the etch process may actually stop before a desired etch depth is attained. of course, one way to deal with such an etch-stop problem is to simply reduce the chamber pressure, but this reduces the plasma ion density and therefore decreases the etch rate and reactor productivity. One way to ameliorate or prevent such a loss of plasma ion density is to increase the plasma source power to compensate for the decrease in chamber pressure. Unfortunately, in a capacitively coupled reactor such an increase in source power proportionately increases the ion bombardment energy at the wafer surface and therefore increases the incidence of device damage, a significant disadvantage. This latter problem is currently dealt with in one of two ways:

(a) The plasma ion density is increased without increasing source power by introducing a rotating magnetic field, which causes the hot electrons to follow a longer spiral path between their birth near the plasma source power radiator and their annihilation at the wafer surface so that each hot electron has a greater number of collisions with etchant ion precursor species and therefore generates more plasma ions at a given source power level. This technique is characteristic of magnetically enhanced reactive ion etch (MERIE) reactors. The problem with this approach is that the plasma tends to localize in a region or "ball" which rotates with the rotating magnetic field, giving rise to a highly non-uniform plasma ion density spatial distribution, which in turn can cause severe non-uniform surface charging, which can cause device damage in corresponding regions on the semiconductor wafer. Thus, it is one object of the present invention to eliminate the need for such an external or rotating magnetic field.

Or, (b) The plasma source power is coupled (e.g., inductively) into the reactor chamber independently of the voltage on the wafer. This is best accomplished by inductively coupling the plasma source power into the chamber. The advantage of this approach is that the ion bombardment energy at the wafer surface can be independently controlled by a separate bias voltage applied to the wafer without affecting plasma source power, so that a high ion density can be achieved with a high plasma source power level while simultaneously a low ion bombardment energy at the wafer surface is provided to prevent device damage. Another advantage of this approach is that the reactor chamber pressure is best maintained at much lower range—e.g., an order of magnitude or so lower than a capacitively coupled reactor, so that the etch stopping characteristic of higher chamber pressures is either eliminated or ameliorated. However, the problem with this approach is that the power distribution of the inductor which couples the plasma source power is quite uneven—tending to be highly localized—relative to that achieved with a homogeneous electrode (e.g., an overhead electrode or conductive ceiling) used in a capacitively coupled plasma reactor. Thus, in a typical inductively coupled reactor, the plasma ion density is high toward the center of the wafer and is low near the periphery of the wafer, a significant disadvantage.

The main object of the present invention is to eliminate or at least significantly reduce the problem of uneven spatial distribution of plasma ion density characteristic of an inductively coupled plasma power source (such as an inductive antenna overlying the plasma chamber ceiling and facing the semiconductor wafer top surface), while not surrendering any of the advantages of inductively coupled plasma reactors, including high plasma ion density (for high etch rate and throughput rate), relatively low wafer bias power (to prevent ion bombardment damage), and low chamber pressure (for reliable etch performance without etch stopping at small feature sizes). One way of attacking such a problem might be to somehow shift the region of plasma ion generation radially outward from the wafer center, so that the plasma ion generation region is an annular or torroidal shaped region closer to the wafer periphery. The problem with this approach is that the plasma ions would be generated near the chamber side wall so that a large proportion of the ions would be lost to collisions with the side wall without ever participating in plasma processing (e.g., etching) at the wafer surface. Thus, the process throughput (e.g., etch rate) would be limited.

Therefore, it is an object of the invention to generate plasma ions in a localized region away from the chamber walls (i.e., near the wafer center) to minimize ion losses to the chamber walls, but without having a concomitant localization of plasma ion distribution at the wafer surface.

SUMMARY OF THE INVENTION

A semiconductor wafer-processing plasma reactor in accordance with one embodiment of the invention includes a reactor chamber including a sidewall and a ceiling, a workpiece support pedestal inside the chamber in generally facing relationship with the ceiling, a process gas inlet to the chamber, a plasma source power applicator capable of coupling plasma source power into the chamber which generates plasma ions in an ion generation region in the chamber, and the ceiling having a contour providing a lesser ceiling height generally near the ion generation region and a greater ceiling height near regions where relatively little plasma ion generation is produced by the plasma source power, the ceiling comprising an annular outer region having an outer perimeter overlying the sidewall and downwardly sloping from the outer perimeter, and an inner flat disk region having an outer perimeter contiguous with an inner radius of the outer annular region, and the outer annular region corresponding to the greater ceiling height and the inner disk corresponding to the lesser ceiling height.

The ceiling be a convex interior surface facing toward the interior of the chamber. The convex interior surface can include a radially outer annular portion and a radially inner portion, the radially outer portion having a height relative to the workpiece support exceeding that of the radially inner portion. The ion generation region is generally located radially inwardly from a periphery of the workpiece support because the power applicator provides a localized distribution of plasma source power whereby the ion distribution region is correspondingly localized within a radius displaced radially inwardly from the side wall to minimize ion recombination losses at the sidewall.

The power applicator can include an inductive coil antenna capable receiving power from an RF plasma source power supply.

The ceiling can have a minimum height over an intermediate portion of the workpiece support and a maximum height near a peripheral portion of the workpiece. The reactor can include a pumping annulus adjacent the chamber sidewall and a vacuum pump coupled to the pumping annulus so as to evacuate the chamber radially outwardly.

The ceiling can further include a center portion surrounded by the radially inner and outer portions of the ceiling, the center portion having a height relative to the workpiece support exceeding that of the radially inner portion, whereby ion diffusion is enhanced from a region underlying the radially inner portion (a) outwardly toward a region overlying the periphery of the workpiece support and (b) inwardly toward a region overlying a center of the workpiece support. In this case, the ion generation region is generally located radially inwardly from a periphery of the workpiece support and radially outwardly from a center of the workpiece support so as to be confined in a torroidal region intermediate the center and periphery of the workpiece support. In such a case, the power applicator provides a localized distribution of plasma source power whereby the ion distribution region is correspondingly localized within a radius displaced radially inwardly from the side wall to minimize ion recombination losses at the sidewall and radially outwardly from a center of the workpiece support. For example, the power applicator can include an inductive coil antenna capable receiving power from an RF plasma source power supply, the power applicator having plural coils confined within an annulus defined by inner and outer radii. Preferably, the power applicator overlies the ceiling and can be conformal with the contour of the ceiling.

The inductive coil antenna can include separate inner and outer winding portions which can be employed to optimize the radial location of the ion generation region relative to the slope of the contoured ceiling by adjusting their relative power levels. Also, the inductive coil antenna can include plural concentric spiral conductors.

More generally, the power applicator is either (a) an inductive antenna, (b) a capacitive electrode, or (c) a microwave power applicator.

DETAILED DESCRIPTION OF THE PREFERRED EMBODIMENTS

The main principle of the present invention is to contour the chamber surface overlying the semiconductor wafer being processed (i.e., the chamber ceiling) in such a way as to promote or optimize the diffusion of plasma ions from their regions of origin to other regions which would otherwise have a relative paucity of plasma ions. This is accomplished by providing a greater chamber volume over those areas of the wafer otherwise experiencing a shortage of plasma ions and a smaller chamber volume over those areas of the wafer experiencing a plentitude of plasma ions (e.g., due to localized plasma generation occurring over the latter areas). Thus, the ceiling is contoured to promote a plasma ion diffusion which best compensates for localized or non-uniform patterns in plasma ion generation typical of an inductively coupled source (e.g., an overhead inductive antenna). A related principle of the invention is to provide a lesser ceiling height (relative to the wafer surface) over regions in which plasma ions are generated or tend to congregate and a greater ceiling height in other regions. More specifically, in the case of an overlying inductive antenna where plasma ion density tends to fall off toward the wafer periphery, the ceiling contour is such that the ceiling height increases radially, i.e., toward the wafer periphery. This promotes or increases plasma ion diffusion toward the wafer periphery as a function of the rate at which the ceiling height increases radially.

Figure 1:
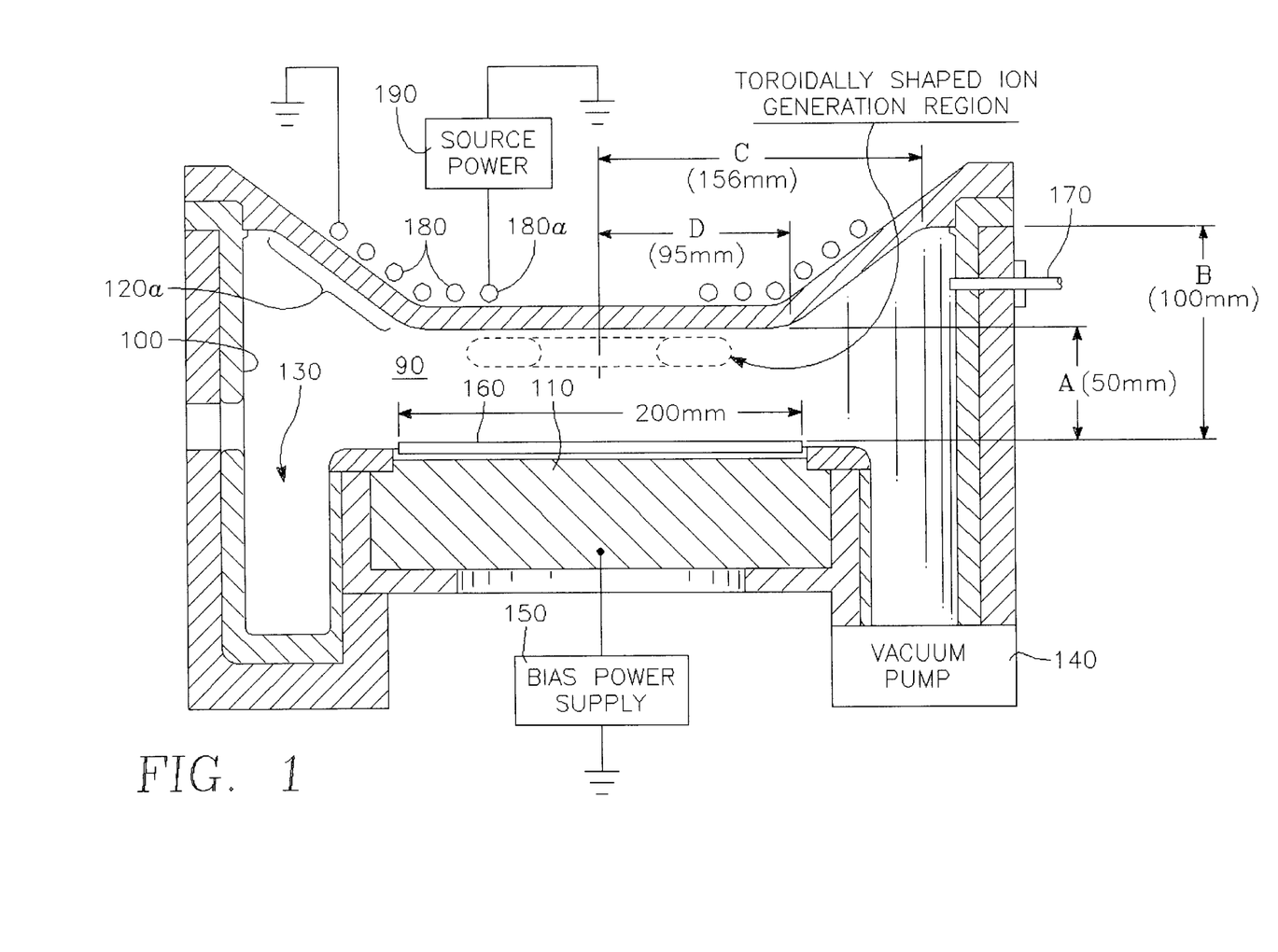
FIG. 1 illustrates an RF plasma reactor corresponding to a first preferred embodiment of the invention.

An example of this concept is illustrated in FIG. 1. An inductively coupled RF plasma reactor includes a cylindrically symmetric chamber 90 which is defined by a cylindrical side wall 100, a wafer support pedestal 110 and an overhead ceiling 120. A pumping annulus 130 extends around the bottom periphery of the chamber 90 and is evacuated by a vacuum pump 140 to maintain the chamber at a desired chamber pressure. The wafer support pedestal 110 is connected to a bias power supply 150. Typically, the bias power supply 150 includes an RF signal generator and an RF match network of the type well-known in the art. The output level of the bias power supply 150 controls the ion bombardment energy at the surface a workpiece or semiconductor wafer 160 (only a portion of which is indicated in FIG. 1) placed on the pedestal 110. Plasma processing gas including (in the case of an etch reactor) etchant precursor species is introduced into the chamber 90 through gas inlets 170. Plasma source power is inductively coupled into the chamber by an overhead inductive antenna 180 consisting of a coil conductor helically wound over the ceiling 120 and having an axis of symmetry coincident with the cylindrical axis of symmetry of the chamber 90. The antenna coil 90 has its interior end 180a connected to the output of an RF plasma source power supply 190. The RF plasma source power supply 190 consists of an RF generator and an RF match network of the type well-known in the art.

Typically, with an inductive antenna coil such as the antenna 180 of FIG. 1, the plasma ion density over the wafer 160 tends to fall off with wafer radius, so that the plasma ion density over the wafer periphery is less than that over most other regions of the wafer 160, if the ceiling 120 were flat. In accordance with the invention, the ion distribution is made to be more nearly uniform by promoting the diffusion of plasma ions from chamber regions overlying the center of the wafer 160 radially outward toward regions overlying the wafer periphery. Promotion of such radially outward diffusion is achieved by increasing the chamber volume overlying the wafer periphery relative to the chamber volume overlying the wafer center region. In the embodiment of FIG. 1, this is accomplished by increasing the ceiling height near the periphery of the ceiling 120 relative to the ceiling center. The rate at which the ceiling height increases with radius (i.e., the slope of the ceiling 120) determines the increase in radially outward diffusion of plasma ions. Therefore, the slope of the ceiling (e.g., the angle relative to the wafer plane of the sloped portion 120a of the ceiling 120 in FIG. 1) is selected in accordance with the amount of radially outward ion diffusion required to overcome the nonuniformity in plasma ion generation. Such nonuniform plasma ion generation is determined by a number of factors, including the pattern of the antenna coil 180. For example, if all the windings of the antenna coil 180 were concentrated extremely close to the center of the chamber, plasma ion generation would be similarly concentrated, requiring an extremely high rate of radially outward ion diffusion to compensate and provide a more nearly uniform ion distribution over the wafer. In such a case, the radially upward slope of the ceiling would have to be similarly extreme, and the adjustment of all plasma process parameters would be proportionately critical, including source power level, chamber pressure, gas inlet flow rate and so forth.

To avoid such an extreme situation, the embodiment of FIG. 1 has its coil antenna 180 distributed radially outward to reduce at least somewhat the concentration of plasma ion generation near the chamber center. This shifts somewhat the region of plasma ion generation radially outwardly. However, unlike the prior art, there is no requirement that the plasma ion generation region is shifted outwardly so far as to be adjacent the chamber side wall. As described previously in this specification, the prior art would have depended on such a radially outward shift alone to render the plasma ion distribution uniform, thus requiring a radical radially outward shift of the ion generation region so that much of the ions would be lost to collisions with the side wall. In the present invention, reliance is mainly upon the enhancement of radially outward ion diffusion by the ceiling contour, so that the only radially outward shift of the ion generation region is a slight one for finely adjusting the ion generation region (typically an annular or toroidally shaped region) to an optimum radial location for a given ceiling contour. This adjustment is best achieved by adjusting the radial distribution of the coil antenna.

In the embodiment of FIG. 1, for example, the radially innermost coil winding of the antenna coil 180 begins at a radius of about 50 mm and the outermost coil winding ends at a radius of about 130 mm. There are approximately six windings of the antenna coil 180 and in the embodiment of FIG. 1 the antenna coil 180 is conformal with the top surface of the ceiling 120, although this is not necessary in carrying out the invention, and other non-conformal implementations of the antenna coil are possible. With the foregoing design choices, the bottom surface of the ceiling 120 is preferably defined by the following dimensions for a 200 mm wafer diameter: the center ceiling height (A) is approximately 50 mm; the height B relative to the wafer surface at the periphery of the ceiling 120 is approximately 100 mm; the ceiling outer radius C is approximately 156 mm; and, the radius D of the center flat portion of the ceiling 120 is approximately 95 mm. The heights A and B can be varied to optimize performance.

Other embodiments may be made in which the entire ceiling is sloped, there being little or no portion of the ceiling which is flat. Or, the radius of the flat portion of the ceiling may be decreased so that a greater portion of the ceiling is upwardly sloped.

Figure 2:
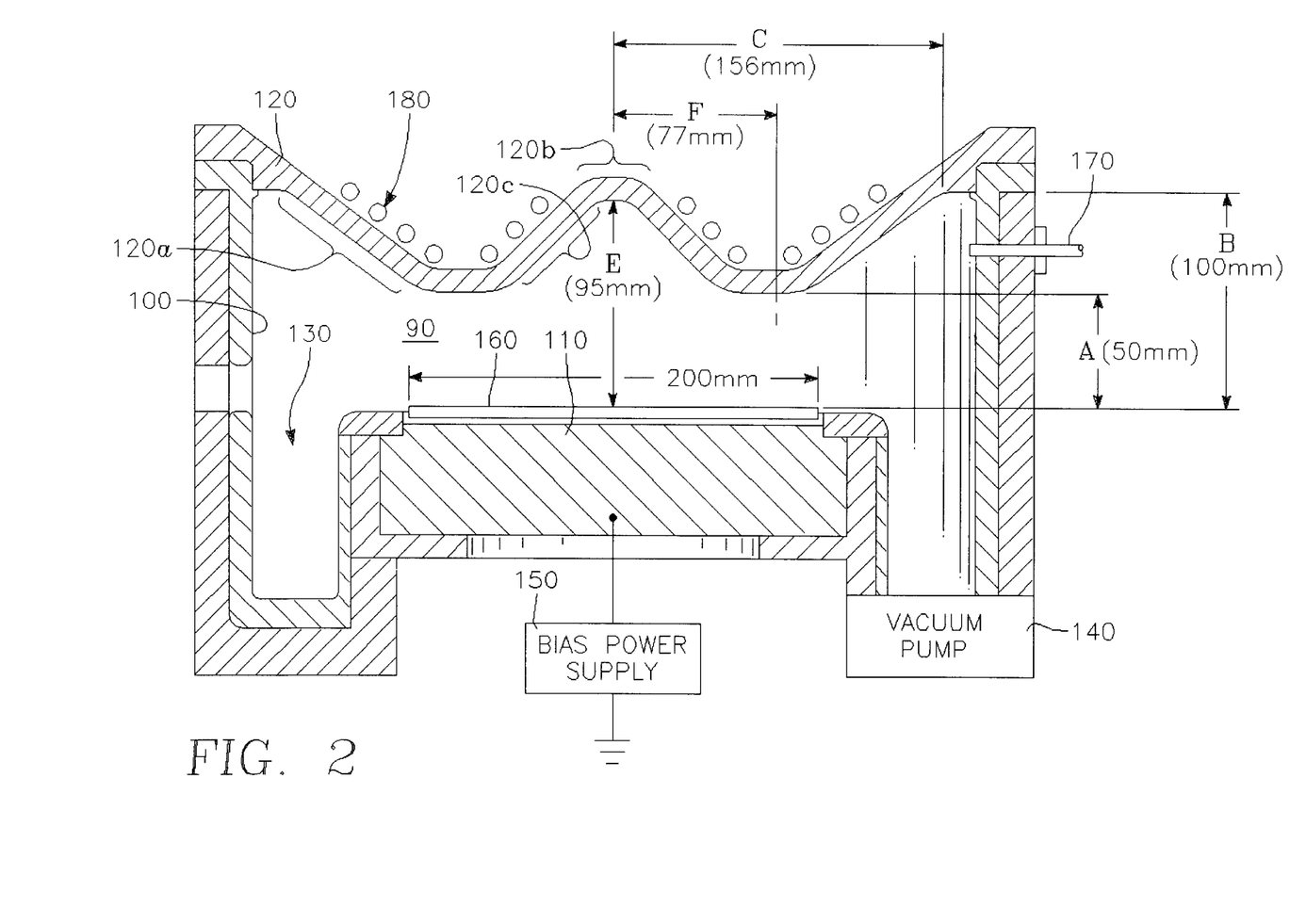
FIG. 2 illustrates an RF plasma reactor corresponding to a second preferred embodiment of the invention.

It may be that the ion density needs to be increased not only at the wafer periphery but also at the wafer center. This situation may arise in those cases in which the plasma ion generation occurs in an annular region outboard of the chamber center. In such a case, the radially outward upwardly sloping ceiling annulus or portion 120a is augmented with a raised center ceiling portion 120b surrounded by a radially inwardly upwardly slopping annulus 120c as shown in FIG. 2. In the embodiment of FIG. 2, the raised center portion 120b has a height E above the wafer 160 of about 95 mm. The radius F dividing the inwardly and outwardly upward sloping ceiling portions 120c, 120a is about 77 mm.

Figure 3:
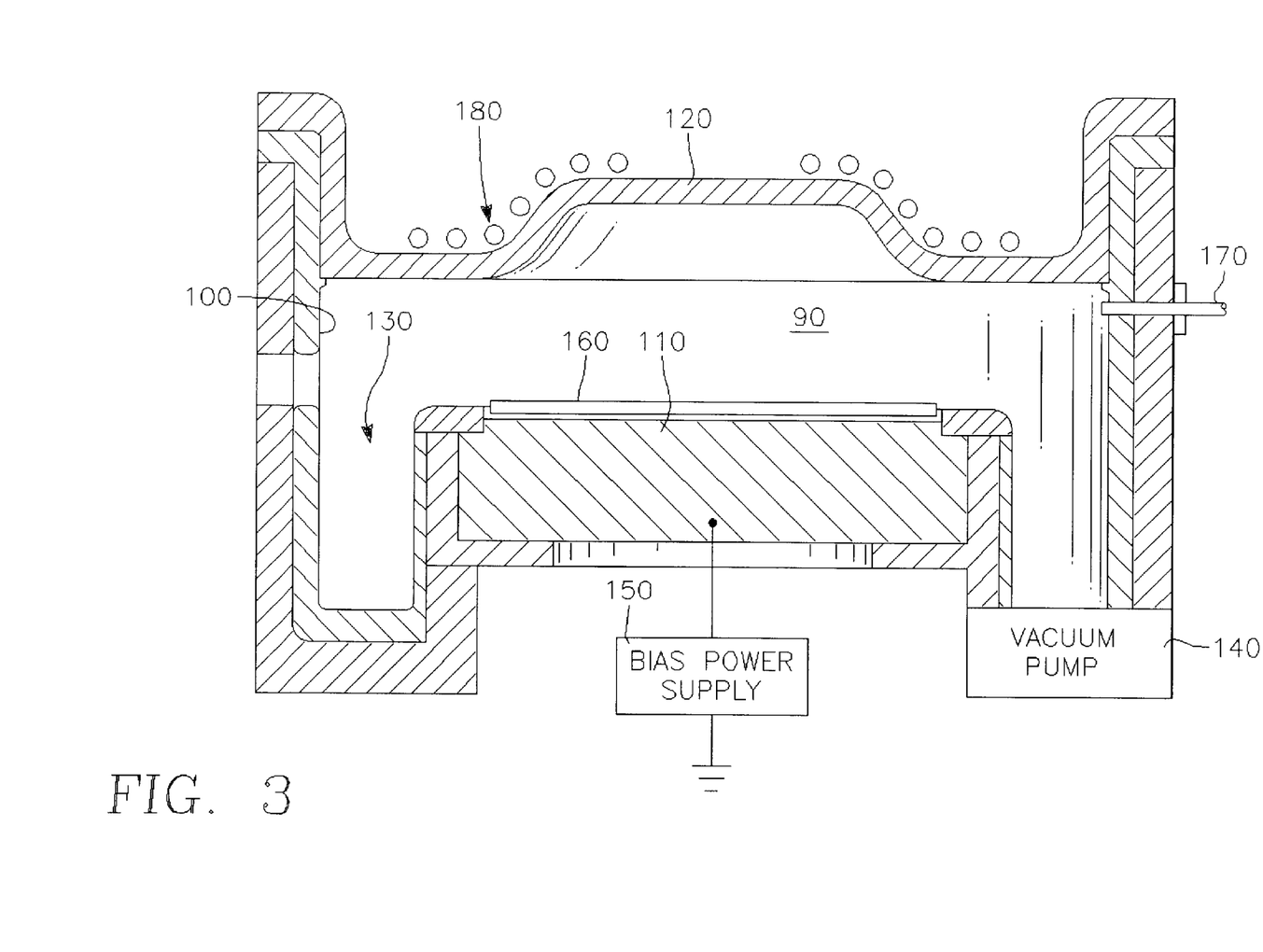
FIG. 3 illustrates an alternative embodiment of the invention.

FIG. 3 illustrates another embodiment in which the only raised portion of the ceiling is the center portion. This embodiment may be useful in those special cases in which only the center region over the wafer 160 requires additional plasma ions to provide a more uniform plasma ion density spatial distribution.

Figure 4:
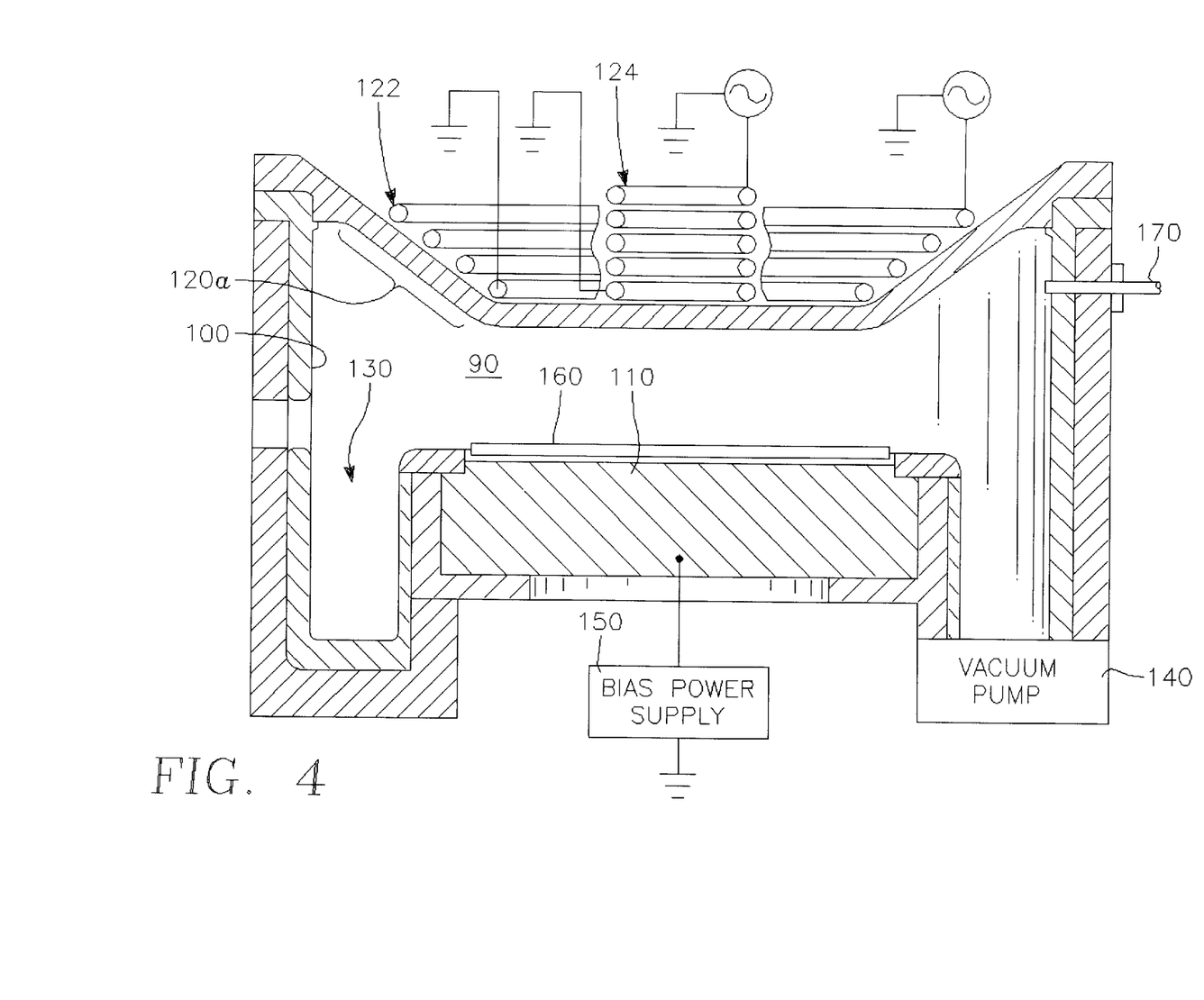
FIG. 4 illustrates another alternative embodiment corresponding to a modification of the embodiment of FIG. 1.

FIG. 4 illustrates how the radial location of the plasma ion generation region may be adjusted by dividing the coil antenna into separately powered inner and outer windings 124, 122. In order to shift the plasma ion generation region radially inwardly, the power applied to the inner winding 124 is increased relative to that applied to the outer winding 122. Conversely, in order to shift the plasma ion generation region radially outwardly, the power applied to the outer winding 122 is increased relative to that applied to the inner winding 124. Such a shift may be necessary in order to optimize the plasma ion distribution for the particular ceiling contour selected in accordance with the invention. Thus, for example, in FIG. 1, angle of the radially outward upward sloped ceiling portion 120a may be relatively small, in which case the plasma ion generation is best shifted further away from the chamber center by increasing the power applied to the outer winding 122 relative to the inner winding 124. Conversely, the angle may be relatively large, in which the ion generation region is best shifted toward the chamber center by increasing the power applied to the inner winding 124 relative to the outer winding 122.

Figure 5:
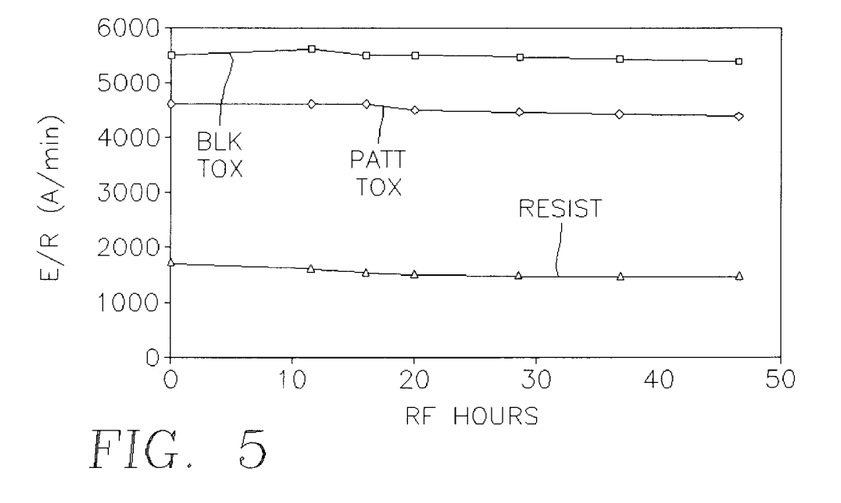
FIG. 5 illustrates the etch rate (vertical axis) in angstroms per minute as a function of operating hours (horizontal axis) obtained in a reactor of the present invention for etching photoresist (triangular symbols), patterned thermal silicon dioxide (square symbols) and thermal silicon oxide (diamond symbols).
Figure 6:
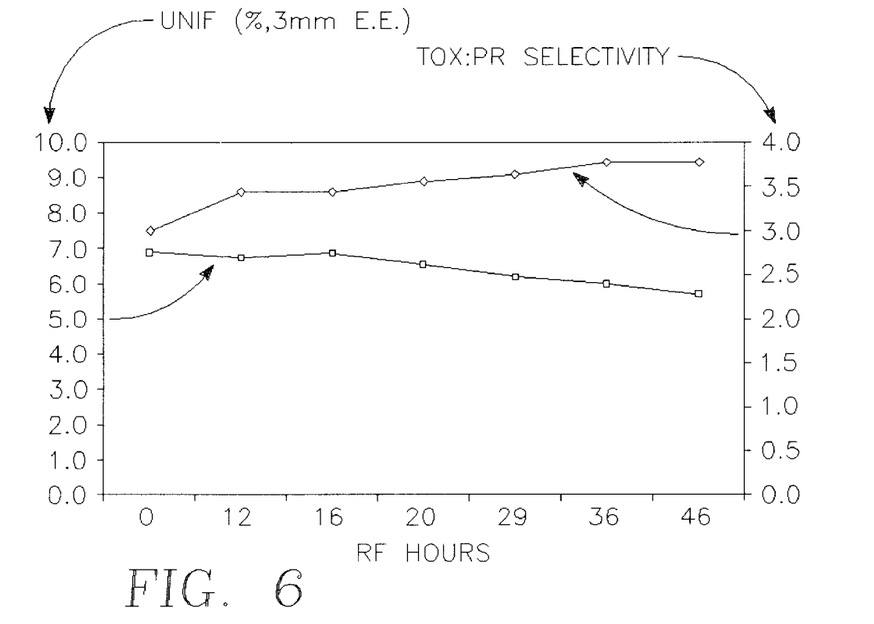
FIG. 6 illustrates etch uniformity as a percentage deviation (left vertical axis) thermal silicon dioxide-to-photoresist etch selectivity as ratio (right vertical axis) as functions of operating hours (horizontal axis) obtaining in a reactor of the present invention.
Figure 7:
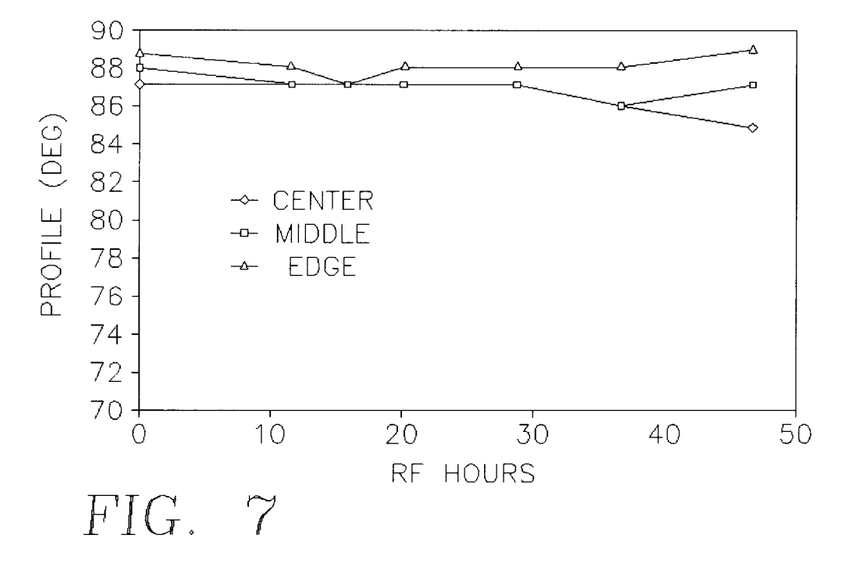
FIG. 7 illustrates etch profile angle in degrees (vertical axis) observed at the wafer center (diamond symbols), wafer middle (square symbols) and wafer edge (triangle symbols) as a function of operating hours (horizontal axis) obtained with a reactor of the present invention.

Another advantage of the invention is that it provides a greater longevity of plasma process stability. Specifically, the reactor of the present invention can be maintained in continuous use for a much longer time between chamber clean operations compared with plasma reactors of the prior art. The remarkable process stability longevity is illustrated by the following data: Etch rate observed over 50 hours of operation (FIG. 5); etch uniformity stability observed over 50 hours of operation (FIG. 6); and, etch profile stability observed over 50 hours of operation (FIG. 7). It is felt that this is attributable to the convex nature of the interior ceiling surface. Other plasma reactors have been disclosed in the art having concave interior ceiling surfaces. The problem is that in a silicon dioxide etch process employing fluorocarbon or fluorohydrocarbon gases, polymer substances deposited onto the ceiling and other surfaces accumulate gradually to form a polymer layer covering such surfaces. Eventually, depending upon the ability of such a layer to cling to the surface (particularly the ceiling surface overlying the wafer), the layer will break up and fall away from the ceiling as particulate contamination and, in some cases, deposit onto the surface of the wafer, thereby changing the etch performance of the reactor. This occurrence is signaled by pronounced changes in etch rate, etch uniformity and/or etch profile, and is avoided by frequently cleaning the interior surfaces of the reactor chamber. The time between such necessary cleaning operations corresponds to the longevity of plasma process stability of the reactor.

Figure 8A:
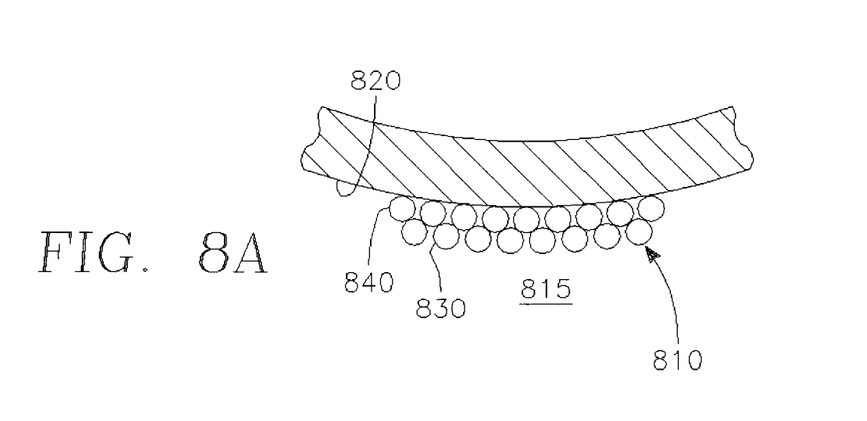
FIG. 8A illustrates formation of polymer molecular layers on a convex ceiling interior surface of the reactor of the present invention.
Figure 8B:
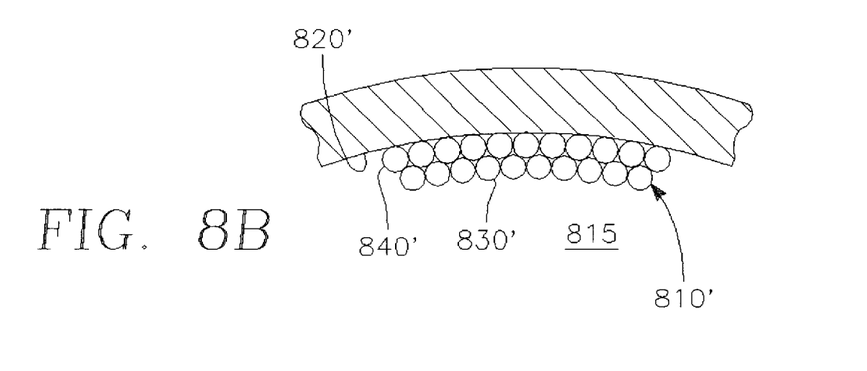
FIG. 8B illustrates formation of polymer molecular layers on a concave ceiling interior surface of a reactor of the prior art.
Figure 9:
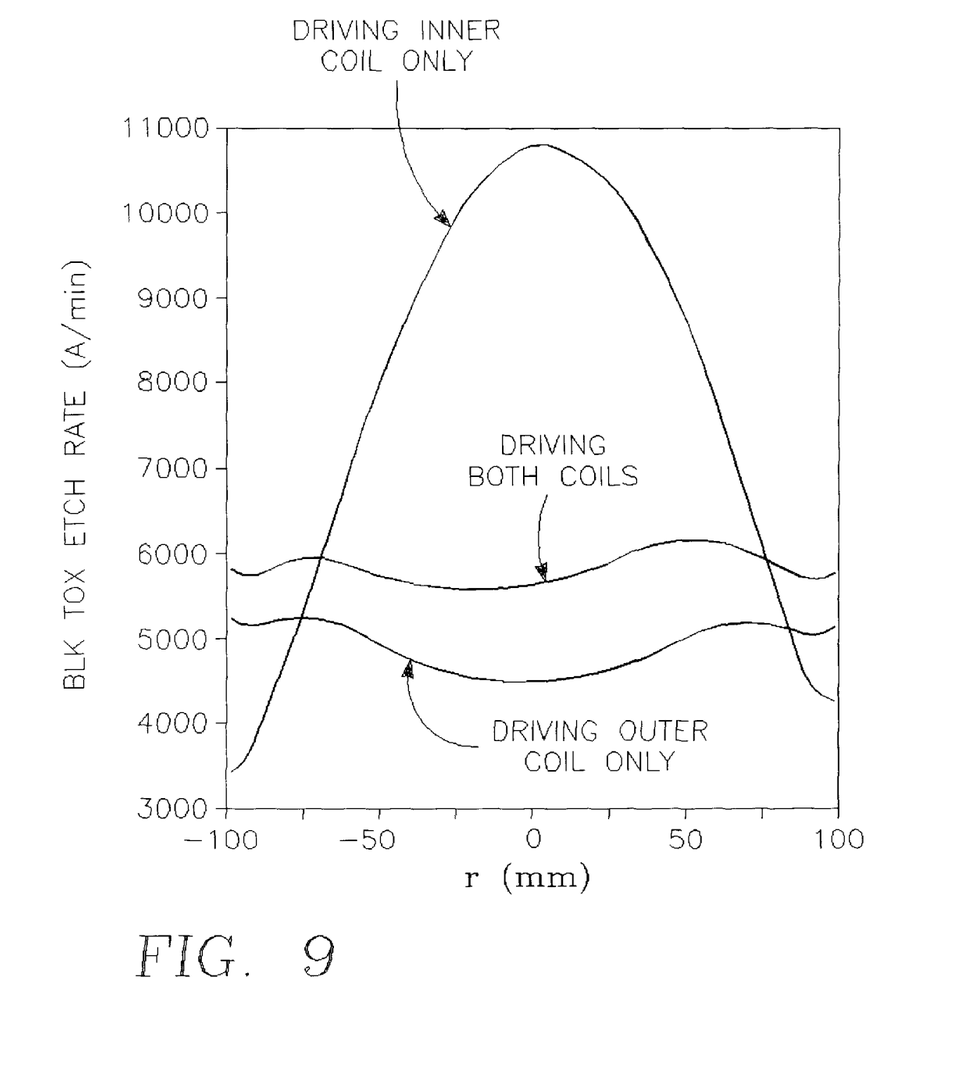
FIG. 9 illustrates etch rate as a function of wafer radius for three different setting of the inner and outer coil power levels of the embodiment of FIG. 4.

It is felt the longer plasma process stability longevity of the reactor of the present invention is due to the convex shape of the ceiling interior surface. Referring to FIG. 8A, polymer particles 810 clinging to a convex ceiling surface 820 experience to layer compression stress because there is plenty of room for the polymer particles of the second outer layer 830 to interstitially fit with those of the first inner layer 840. In contrast, in FIG. 8B, the second layer 830' is compressed laterally in trying to interstitially fit with the polymer particles of the underlying first layer 840', and as a result are more susceptible to thermal stress and do not cling as strongly to the ceiling. Thus, the convex interior ceiling shape of the invention facilitates a stronger polymer adherence to the ceiling and therefore a greater plasma process stability longevity FIG. 9 illustrates how the relative inner and outer coil power levels of the embodiment of FIG. 4 can be adjusted for a particular ceiling contour to adjust plasma ion density spatial distribution so as to optimize uniformity of etch rate across the wafer. The curve with the highest center peak of FIG. 9 illustrates plasma ion density as a function of radius from the wafer center for power applied predominantly to the inner coil. The curve having the most pronounces center dip of FIG. 9 illustrates plasma ion density as function of radius from the wafer center for power applied predominantly to the outer coil. The remaining curve, that one most nearly approximating a straight line, illustrates the case in which power is applied to both inner and outer coils in a ratio which most nearly optimizes uniformity of plasma ion density spatial distribution.

The three curves of FIG. 9, or at least ones similar thereto, could be generated by other means without any change in relative power levels applied to the inner and outer coils. Specifically, the curve of FIG. 9 indicating the greatest concentration of plasma ions over the wafer center could be produced by employing a ceiling which has an insufficiently steep upward contour toward the outer periphery (i.e., the angle relative to the plane of the wafer 160 of the sloped ceiling portion 120a is reduced relative to an optimum angle). The curve of FIG. 9 indicating a minimum ion density at the wafer center could be produced by employing a ceiling having an excessively steep upward contour toward the outer periphery (i.e., the angle relative to the plane of the wafer 160 of the sloped portion 120a is increased beyond an optimum angle). The remaining curve indicating the most uniform ion distribution corresponds to an ideal ceiling slope.

Advantages and Uses of the Invention:

The invention solves the problem of uneven spatial distribution of plasma ion density characteristic of an inductively coupled plasma power source (such as an inductive antenna overlying the plasma chamber ceiling and facing the semiconductor wafer top surface), while not surrendering any of the advantages of inductively coupled plasma reactors, including high plasma ion density (for high etch rate and throughput rate), relatively low wafer bias power (to prevent ion bombardment damage), and low chamber pressure (for reliable etch performance without etch stopping at small feature sizes). The invention accomplishes all this without requiring any shifting of the region of plasma ion generation radially outward from the wafer center toward or near the chamber side wall. This avoids the loss of many plasma ions to collisions with the side wall. Instead, the invention facilitates plasma ion generation in a localized region away from the chamber walls (i.e., near the wafer center) to minimize ion losses to the chamber walls, but without having a concomitant localization of plasma ion distribution at the wafer surface. The invention compensates for such localized plasma ion generation by enhancing plasma ion diffusion into other regions by contouring the chamber ceiling to promote or increase such diffusion. The ceiling contour of the invention which best promotes such diffusion, namely a convex interior ceiling surface shape, provides the additional advantage of greater process stability longevity, since the polymer materials deposited thereon cling with greater adhesion to a convex surface than the concave ceiling surfaces of the prior art.

While the inductive coil antennas illustrated in the drawings are single-conductor helically wound coils, it is preferred that each coil be a "hurricane" coil with multiple concentric spirals of the type disclosed in co-pending U.S. patent application Ser. No. 08/886.240 filed Jun. 30. 1997 entitled "INDUCTIVELY COUPLED PLASMA REACTOR WITH SYMMETRICAL PARALLEL MULTIPLE COILS HAVING A COMMON RF TERMINAL" by Xue-Yu Qian et al., the disclosure of which is incorporated herein by reference in its entirety.

While the invention has been disclosed with reference to embodiments employing an inductively coupled plasma RF source power radiator (i.e., a coil antenna), another suitable source power may be employed, such as a microwave source or even a capacitively coupled source.

While the invention has been described in detail with specific reference to preferred embodiments thereof, it is understood that variations and modifications thereof may be made without departing from the true spirit and scope of the invention.

What is claimed is:

1. A plasma reactor for processing a semiconductor workpiece, said reactor comprising:
   a reactor chamber comprising a sidewall and a ceiling;
   a workpiece support pedestal inside said chamber in generally facing relationship with said ceiling;
   a process gas inlet to said chamber;
   a plasma source power applicator capable of coupling plasma source power into said chamber which generates plasma ions in an ion generation region in said chamber; and
      said ceiling having a contour providing a lesser ceiling height generally near said ion generation region and a greater ceiling height near regions where relatively little plasma ion generation is produced by said plasma source power;
   said ceiling comprising an annular outer region having an outer perimeter overlying the sidewall and downwardly sloping from said outer perimeter, and an inner flat disk region having an outer perimeter contiguous with an inner radius of the outer annular region; and
   said outer annular region corresponding to said greater ceiling height and said inner disk corresponding to said lesser ceiling height.

2. The reactor of claim 1 wherein said ceiling comprises a convex interior surface facing toward the interior of said chamber.

3. The reactor of claim 2 wherein said convex interior surface comprises a radially outer annular portion and a radially inner portion, said radially outer portion having a height relative to said workpiece support exceeding that of said radially inner portion.

4. The reactor of claim 3 wherein said ion generation region is generally located radially inwardly from a periphery of said workpiece support.

5. The reactor of claim 4 wherein said power applicator provides a localized distribution of plasma source power whereby said ion distribution region is correspondingly localized within a radius displaced radially inwardly from said side wall to minimize ion recombination losses at said sidewall.

6. The reactor of claim 5 wherein said power applicator comprises an inductive coil antenna capable of receiving power from an RF plasma source power supply.

7. The reactor of claim 4 wherein said ceiling has a minimum height over an intermediate portion of said workpiece support and a maximum height near a peripheral portion of said workpiece.

8. The reactor of claim 7 further comprising a pumping annulus adjacent said chamber sidewall and a vacuum pump coupled to said pumping annulus so as to evacuate said chamber radially outwardly.

9. The reactor of claim 3 wherein said ceiling further comprises a center portion surrounded by said radially inner and outer portions of said ceiling, said center portion having a height relative to said workpiece support exceeding that of said radially inner portion, whereby ion diffusion is enhanced from a region underlying said radially inner portion (a) outwardly toward a region overlying the periphery of said workpiece support and (b) inwardly toward a region overlying a center of said workpiece support.

10. The reactor of claim 9 wherein said ion generation region is generally located radially inwardly from a periphery of said workpiece support and radially outwardly from a center of said workpiece support so as to be confined in a torroidal region intermediate said center and periphery of said workpiece support.

11. The reactor of claim 10 wherein said power applicator provides a localized distribution of plasma source power whereby said ion distribution region is correspondingly localized within a radius displaced radially inwardly from said side wall to minimize ion recombination losses at said sidewall and radially outwardly from a center of said workpiece support.

12. The reactor of claim 11 further comprising a pumping annulus adjacent said chamber sidewall and a vacuum pump coupled to said pumping annulus so as to evacuate said chamber radially outwardly.

13. The reactor of claim. 12 wherein said power applicator comprises an inductive coil antenna capable receiving power from an RF plasma source power supply, said power applicator having plural coils confined within an annulus defined by inner and outer radii.

14. The reactor of claim 1 wherein said power applicator overlies said ceiling.

15. The reactor of claim 6 wherein said inductive antenna overlies said ceiling.

16. The reactor of claim 15 wherein said inductive antenna is conformal with the contour of said ceiling.

17. The reactor of claim 11 wherein said power applicator overlies said ceiling.

18. The reactor of claim 17 wherein said power applicator is conformal with contour of said ceiling.

19. The reactor of claim 1 wherein said power applicator comprises one of: (a) an inductive antenna; (b) a capacitive electrode; (c) a microwave power applicator.

20. The reactor of claim 6 wherein said inductive coil antenna comprises separate inner and outer winding portions.

21. The reactor of claim 6 wherein said inductive coil antenna comprises plural concentric spiral conductors.

22. A method of processing a semiconductor workpiece in a plasma reactor having a reactor chamber comprising a sidewall and a ceiling, a workpiece support pedestal inside said chamber in a generally facing relationship with said ceiling, a process gas inlet to said chamber, a plasma source power applicator capable of coupling plasma source power into said chamber which generates plasma ions in an ion generation region in said chamber, said ceiling comprising an annular outer region having an outer perimeter overlying the sidewall and an inner flat disk region having an outer perimeter contiguous with an inner radius of the outer annular region, the method comprising:
   providing for localized plasma ion generation in a region generally overlying said workpiece support and displaced away from sidewalls of a chamber of said reactor and nearer a center portion of said chamber;
   evacuating said chamber toward periphery thereof; and
   promoting radially outward diffusion of gases in said chamber by increasing a height of said ceiling with a radius thereof so as to define a contour of said ceiling, so that said ceiling is downwardly sloping from said outer perimeter, said outer annular region corresponding to a greater ceiling height and said inner disk corresponding to a lesser ceiling height.

23. The method of claim 22 wherein said contour corresponds to a convexly shaped interior surface of said ceiling.

24. The method of claim 22 further comprising providing separate radially inner and outer RF power applicator sections and adjusting the relative RF power levels applied to said sections to optimize an ion generation radial location relative to said contour of said ceiling.

25. A plasma reactor for processing a semiconductor workpiece, comprising:
   a reactor chamber comprising a sidewall and a ceiling;
   a workpiece support pedestal inside said chamber in generally facing relationship with said ceiling;
   a process gas inlet to said chamber;
   a plasma source power applicator which provides a localized ion generation region displaced radially inwardly from said sidewall whereby to minimize ion recombination losses at said sidewall;
   said ceiling having a contour providing a lesser chamber volume section over said ion generation region and a greater chamber volume section over regions where relatively little plasma ion generation is produced by said plasma source power;
   said ceiling comprising an annular outer region having an outer perimeter overlying the sidewall and downwardly sloping from said outer perimeter, and an inner flat disk region having an outer perimeter contiguous with an inner radius of the outer annular region; and
   said outer annular region corresponding to said greater chamber volume section and said inner disk corresponding to said lesser chamber volume section.

26. The reactor of claim 25 wherein said ceiling comprises a convex interior surface facing toward the interior of said chamber.

27. The reactor of claim 26 wherein said convex interior surface comprises a radially outer annular portion and a radially inner portion, said radially outer portion overlying a chamber volume section exceeding the chamber volume section underlying said radially inner portion.

28. The reactor of claim 25 wherein said power applicator comprises an inductive coil antenna capable receiving power from an RF plasma source power supply.

29. The reactor of claim 27 further comprising a pumping annulus adjacent said chamber sidewall and a vacuum pump coupled to said pumping annulus so as to evacuate said chamber radially outwardly.

30. The reactor of claim 27 wherein said ceiling further comprises a center portion surrounded by said radially inner and outer portions of said ceiling, said center portion overlying a chamber volume section exceeding the chamber volume section underlying said radially inner portion, whereby ion diffusion is enhanced from a region underlying said radially inner portion (a) outwardly toward a region overlying the periphery of said workpiece support and (b) inwardly toward a region overlying a center of said workpiece support.

31. The reactor of claim 25 wherein said power applicator comprises an inductive coil antenna capable of receiving power from an RF plasma source power supply, said power applicator having plural coils confined within an annulus defined by inner and outer radii.

32. The reactor of claim 28 wherein said inductive antenna is conformal with the contour of said ceiling.

33. The reactor of claim 25 wherein said power applicator comprises one of: (a) an inductive antenna; (b) a capacitive electrode; (c) a microwave power applicator.

34. The reactor of claim 28 wherein said inductive coil antenna comprises separate inner and outer winding portions.

35. The reactor of claim 28 wherein said inductive coil antenna comprises plural concentric spiral conductors.

36. A plasma reactor for processing a semiconductor workpiece, said reactor comprising:
   a reactor chamber comprising a sidewall and a ceiling;
   a workpiece support pedestal inside said chamber in generally facing relationship with said ceiling;
   a process gas inlet to said chamber;
   a plasma source power applicator capable of coupling plasma source power into said chamber which generates plasma ions in an ion generation region in said chamber;
   said plasma source power applicator comprising an inductive antenna; and
   said ceiling having a contour providing a lesser ceiling height generally near said ion generation region and a greater ceiling height near regions where relatively little plasma ion generation is produced by said plasma source power;
   said ceiling comprising an annular outer region having an outer perimeter overlying the sidewall and downwardly sloping from said outer perimeter, and an inner flat disk region having an outer perimeter contiguous with an inner radius of the outer annular region;
   said outer annular region corresponding to said greater ceiling height and said inner disk corresponding to said lesser ceiling height.

* * * * *